United States Patent [19]

Hayashi

[11] Patent Number: 4,611,926
[45] Date of Patent: Sep. 16, 1986

[54] TIME INTERVAL MEASURING INSTRUMENT

[75] Inventor: Mishio Hayashi, Saitama, Japan

[73] Assignee: Takeda Riken Kogyo Kabushikikaisha, Tokyo, Japan

[21] Appl. No.: 656,853

[22] Filed: Oct. 2, 1984

[30] Foreign Application Priority Data

Oct. 7, 1983 [JP] Japan ................................ 58-188778

[51] Int. Cl.[4] ................................................. G04F 8/00
[52] U.S. Cl. ..................................................... 368/120
[58] Field of Search ................................ 368/120–122; 328/111, 129.1; 375/118; 307/234

[56] References Cited

U.S. PATENT DOCUMENTS

| 4,074,358 | 2/1978 | Caputo et al. | 328/112 |
| 4,320,516 | 3/1982 | Kammerlander | 375/118 |
| 4,320,526 | 3/1982 | Gitlin | 375/118 |
| 4,412,299 | 10/1983 | Huffman | 375/118 |

Primary Examiner—Bernard Roskoski
Attorney, Agent, or Firm—Staas & Halsey

[57] ABSTRACT

An input time signal and clock pulses are provided to a gate, from which the clock pulses are output for a period of time corresponding to the duration of the input time signal, and the clock pulses are applied to a time counter. The time counter is preset, for each measurement, by to a time corresponding to minimum and maximum values of a time interval to be measured and yields a validity signal for a period of time therebetween. The minimum and maximum values of the time interval to be are referenced from the start of the supply of the clock pulses. It is decided and only for whether the validity signal exists at the end of the input time signal, an input time signal that ends during the duration of the validity signal, is its measured duration utilized as valid data.

18 Claims, 32 Drawing Figures

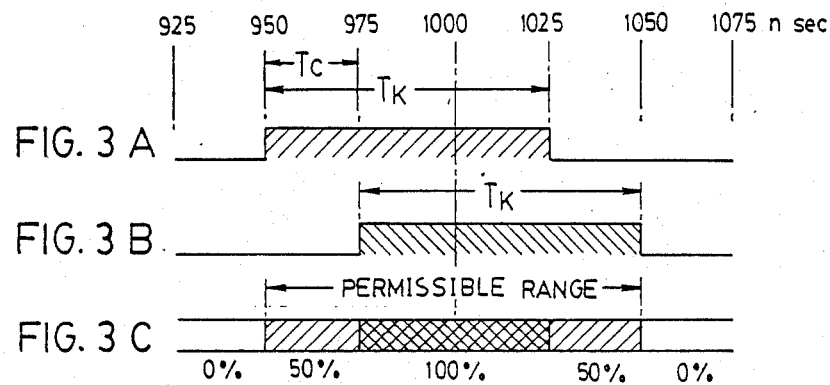
FIG. 3 A
FIG. 3 B
FIG. 3 C
FIG. 8
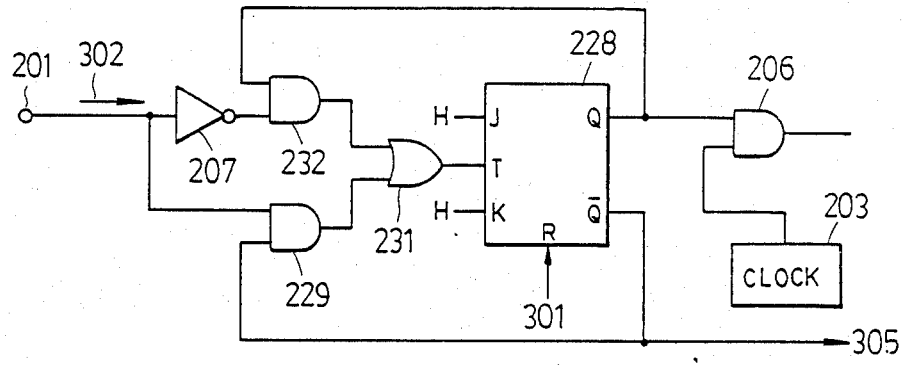

TIME INTERVAL MEASURING INSTRUMENT

BACKGROUND OF THE INVENTION

The present invention relates to an instrument which measures a time interval of an input signal thereto, that is, a time signal of a pulse interval or width corresponding to the time interval to be measured, and more particularly to a time interval measuring instrument which measures the durations of input time signals within a predetermined range.

For example, in a digital audio player system, it is customary, for evaluating its quality, to measure fluctuations in the pulse width of pulses available from a pickup, what is called jitter. In the digital audio player, audio information is rendered into a PCM (Pulse Code Modulation) code and its PCM code pulse train is recorded as an NRZ (Non-Return to Zero) waveform. On account of this, the output from the pickup includes pulses having various widths at random, which are an integral multiple of a fundamental clock period. For measuring jitter of the pulse width, it is necessary to extract a pulse of a nominal predetermined pulse width. Not only in the digital audio player but also in apparatuses which usually employ a PCM code train or a so-called data pulse train, as an NRZ waveform, for various data transfers, data storage and data processing, it is necessary, for measuring jitter of the pulse width, to conduct measurements for pulses of a specified nominal width among a number of pulses of various widths which exist at random.

In the case of measuring jitter of pulses of various pulse widths by the existing time interval measuring instrument, such pulse signals (time signals) as, for example, those from the pickup of the aforesaid digital audio player, are input into the time interval measuring instrument, wherein the input pulse signals are extracted at random and their pulse widths (durations) measured, and the measured data are transferred to a controller. The controller is constituted by a microcomputer, in which only data on a specified pulse width are extracted from the measured data transferred thereto and the amount of jitter of the pulse is statistically obtained from the extracted data. For example, a mean value of the extracted measured values, a standard deviation of the amount of jitter and a difference between minimum and maximum values of the pulse widths (what is called a range) are calculated.

For obtaining each statistics as the mean value and the standard deviation, at least 100 measured data are desirably needed. However, the abovementioned conventional measuring instrument requires, for each measurement, a total of $T_X + T_R + T_C$ which is the sum of a time $T_X$ for measuring the time interval (the pulse width), a time $T_R$ for transferring the measured data to the controller and a time $T_C$ for deciding whether the measured data corresponds to the specified nominal pulse width. The data transfer is carried out by, for instance, the GP-IB transfer procedure, but the data transfer time $T_R$ is as long as 10 milliseconds or so. An increase in the time for each measurement inevitably causes an increase in the time necessary for obtaining a required number of measured data. For example, if the time for each measurement is about 100 milliseconds, then 10 seconds or so is needed for obtaining 100 measured data. Moreover, it must be taken into account that all the 100 measured data thus obtained in succession need not necessarily be those of the specified pulse width but contain many inappropriate data of other pulse widths than the specified one. Accordingly, it is necessary, in practice, to obtain more measured data and to extract therefrom appropriate data of the specified pulse width. Therefore, for instance, if 1,000 to 10,000 measured data are needed for obtaining 100 measured data of the specified nominal pulse width, then the measurement time may require 100 to 1000 seconds, resulting in much time being consumed for the measurement of jitter.

SUMMARY OF THE INVENTION

It is therefore an object of the present invention to provide a time interval measuring instrument which permits measurement of the duration of a specified one of input time signals of various durations.

According to the present invention, it is checked on a real time basis, simultaneously with the measurement of the duration of an input time signal, whether its duration is within a preset range. Only in the case where it is within an appropriate range, i.e. the preset range, is a measured value of the duration of the corresponding input time signal utilized as valid data. The input time signal and clock pulses are input into gate means, from which the clock pulses are output for a period of time corresponding to the duration of the input time signal. The output clock pulses are provided to time counter means. The time counter means is preset, for each measurement, by control means to a value corresponding to a minimum value of a time interval to be measured and, as required to, a value corresponding to a maximum value of the time interval to be measured or a value corresponding to a permissible range which is the difference between the minimum and maximum values. The time counter means yields a validity signal over the time interval spanning from the minimum value to the maximum value of the time interval to be measured in reference to the start of supply of the clock pulses. It is decided by decision means whether the validity signal is being generated at the end of the input time signal. On the other hand, the duration of the input time signal is measured by measuring means. The control means refers to the result of decision by the decision means and inputs thereinto, as valid data, the measured value for the input time signal decided as ending in the duration of the validity signal.

The time counter means includes minimum value counting means. The minimum value counting means is preset to a value corresponding to the minimum value, counts the clock pulses and yields an output when having counted for a period of time corresponding to the minimum value of the time interval to be measured. Timer means is activated by this output to yield the validity signal for a period of time corresponding to the permissible range. The timer means may be substituted by maximum value counting means. A value corresponding to the maximum value is preset in the maximum value counting means, which generates an output when having counted the clock pulses for the period of time corresponding to the maximum value of the time interval to be measured. The validity signal is produced over the time interval between the occurrence of the output from the minimum value counting means and the occurrence of the output from the maximum value counting means. The measuring means may also be used as the minimum or maximum value counting means at the same time. Higher accuracy of measurement can be achieved by using measuring means which is higher in accuracy than the minimum or maximum value counting means, such as disclosed, for instance, in U.S. Pat. No. 4,267,436 issued May 12, 1981.

In the control means, the valid data input thereto are displayed on a display, and such statistics as a mean value or standard deviation of the input valid data or their jitters are calculated and displayed on the display.

As described above, the present invention does not involve a transfer of the measured data and a decision of whether the transferred measured data is within a preset time interval, and hence permits reduction of the time for obtaining one measured value. Since measurement is made only for an input time signal of a specified duration (pulse width), many measured data can be obtained efficiently in a short time. Accordingly, for example, jitter can be measured in a short time.

BRIEF DESCRIPTION OF THE DRAWINGS

FIGS. 3A to 3C show the state of generation of a validity signal;

FIG. 8 is a logic circuit diagram showing another example of gate means 202.

DESCRIPTION OF THE PREFERRED EMBODIMENTS

Figure 1:
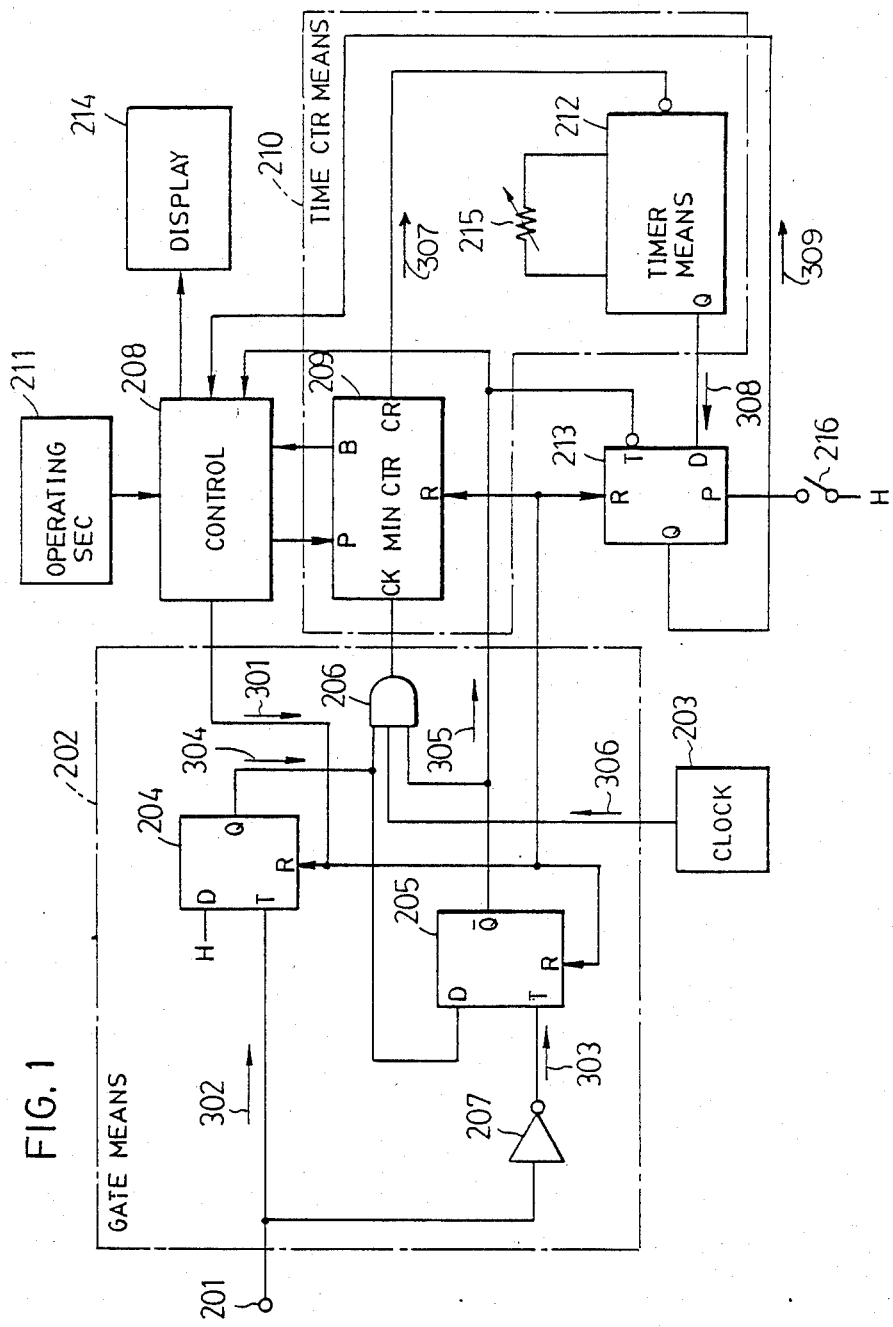
FIG. 1 is a block diagram illustrating an embodiment of the time interval measuring instrument of the present invention.
Figure 2:
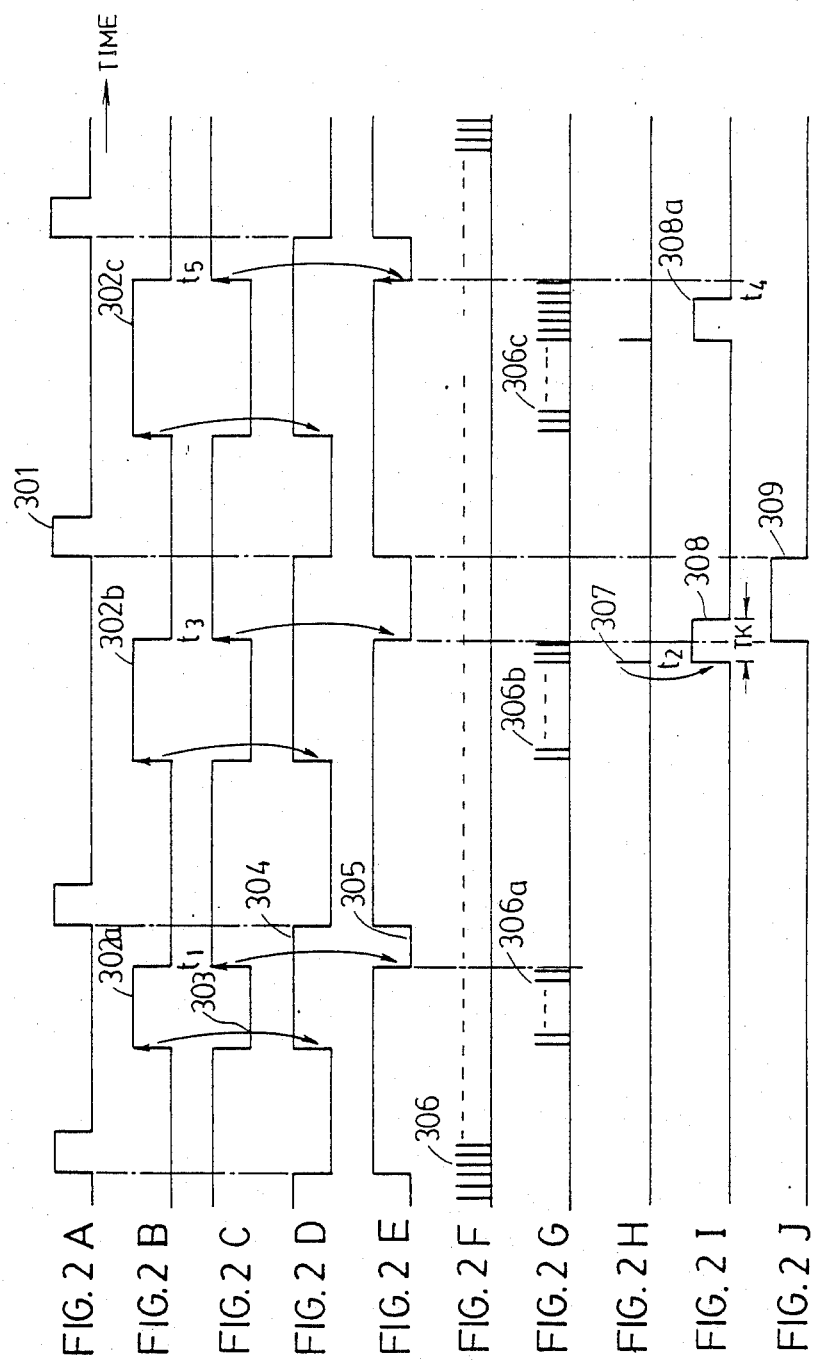
FIGS. 2A through 2J are timing charts explanatory of the operation of the instrument shown in FIG. 1.

FIG. 1 illustrates in block form an embodiment of the time interval measuring instrument of the present invention. To an input terminal 201 is supplied such an input time signal 302 as shown in FIG. 2B, which is, in this example, a train of pulses each having one of a plurality of predetermined nominal pulse widths with a certain degree of jitter. The input time signal 302 is provided to gate means 202, wherein clock pulses 306 shown in FIG. 2F, from a clock pulse source 203, are taken out only in the period corresponding to the input time (the pulse width in this embodiment) of the input time signal 302. The clock pulses thus taken out are shown in FIG. 2G.

The gate means 202 in this example is comprised of two D flip-flops 204 and 205, an inverter 207 and an AND circuit 206. The one D flip-flop 204 is supplied at its data terminal D with an "H" logic signal and has its trigger terminal T connected directly to the input terminal 201 and its Q output terminal connected to an input terminal of the AND circuit 206 and the data terminal D of the other D flip-flop 205. The other D flip-flop 205 has its trigger terminal T connected via the inverter 207 to the input terminal 201 and its $\bar{Q}$ output terminal connected to another input terminal of the AND circuit 206 and a controller 208 described later. The two D flip-flops 204 and 205 are each supplied at their reset terminal R with a reset signal 301 shown in FIG. 2A, from the controller 208, and they are reset simultaneously.

The clock pulses from the gate means 202, that is, the output clock pulses from the AND circuit 206, are provided to time counter means 210. The time counter means 210 counts the clock pulses thus input thereto and yields a validity signal 308 of a duration between minimum and maximum values of a specified time interval to be measured. In this example, the time counter means 210 is comprised of a minimum value counter 209 and a monostable multivibrator 212 serving as a timer means. The counter 209 is formed, for example, by a presettable synchronous decimal counter and counts the clock pulses extracted by the gate means 202. The counter 209 is preset to such a value that it produces a carry signal upon counting clock pulses of a number corresponding to a permissible minimum value of the time interval to be measured.

Now, a description will be given of the value that is preset in the counter 209 in connection with the case of measuring jitter of an input time signal (i.e., an input pulse signal) having a duration (i.e., a pulse width) of one microsecond, for instance. Assuming that the clock period $T_0$ of the clock pulses is, for example, 25 nanoseconds, when a jitter-free pulse signal having a pulse width of one microsecond is applied, $1 \times 10^{-6}$ sec/$25 \times 10^{-9}$ sec$=40$ pulses will be derived from the gate means 202. Provided that the counter 209 comprises five stages of decimal counters, when "99960" are preset, as a sequence of decimal digits, in the counter 209, a carry signal will be produced therefrom in the case of the jitter-free pulse signal having a pulse width of one microsecond being input.

By the way, jitter occurs as fluctuations in both positive and negative directions with respect to a jitter-free pulse width. Therefore, it is necessary to define the range of jitter with respect to a standard pulse signal. For example, in the case of taking out only input time signals (input pulse signals) whose jitter is within $\pm 50$ nanoseconds, if a one microsecond period is used as a reference for a standard pulse width, then the permissible range for discrimination has a width of 1 microsecond $\pm 50$ nanoseconds. Accordingly, it is necessary, in this case, to simply collect measured values only for input time signals of pulses whose pulse durations are longer than 950 nanoseconds but shorter than 1050 nanoseconds.

Since the counter 202 counts clock pulses of a preknown period from the clock pulse source 203, its count value corresponds to time. Accordingly, the lapse of time from the rise of the input time signal can be detected from the count value of the counter 202. To this end, according to the present invention, the value to be preset in the counter 209 is determined so that it produces a carry signal when having counted a value corresponding to the minimum value of the permissible range of the time interval to be measured.

The value P which is preset in the counter 209 is defined as follows:

$$P = 10^N - (A - \delta)/T_0 \qquad (1)$$

wherein A is the reference time interval (the reference pulse width), $\pm \delta$ is the permissible range of jitter and $T_0$ is the period of clock pulses. For instance, in the case where $A = 1$ microseconds, $\delta = 50$ nanoseconds and $T_0 = 25$ nanoseconds, it follows that the count value for the minimum pulse width to be discriminated is $950 \times 10^{-9}$ sec/$25 \times 10^{-9}$ sec$=38$, and the preset value P should be a $10^N$'s complement of 38; namely, if the number of stages N of the counter 209 is 5, then P=100,000−38=99,962. The reference time interval (the reference pulse width) A and the value of δ for the permissible range of jitter are entered from an operating section 211 to a controller 208, wherein they are subjected to arithmetic processing pursuant to Eq. (1) and preset in the counter 209.

In this example, when the minimum value of the permissible time interval starting at the rise of the input time signal 302 is detected, as a carry signal, by the counter 209, a timer means 212 is activated by the output. As the timer means 212, use can be made of a monostable multivibrator, for example. The operating time $T_K$ of the timer means 212, i.e., the width of the validity signal 308 is selected to be such a value that the time $T_0$ of one clock period is subtracted from the permissible range of jitter. That is, indefiniteness of one clock period is contained in the time interval between the rise of the input time signal 302 and the start of counting of the clock pulses by the counter 209, and in order to eliminate input signals which exceed the permissible range, even if slightly, the operating time $T_K$ of the timer means 212 is selected to be 2δ−$T_0$. In this example, since the permissible range ±δ is selected to be ±50 nanoseconds, the operating time $T_K$ of the timer means 212 is set to (100−25) nanoseconds. The timer means 212, while in operation, derives an H logic, as a validity signal 308, during the period $T_K$ as shown in FIG. 2I.

The validity signal 308 from the time counter means 210, that is, the output from the timer means 212 in this example, is provided to decision means 213, wherein it is decided whether the validity signal 308 is present at the time point of termination (fall) of the input time signal 302. The decision means 213 is constituted by, for instance, a D flip-flop. The output validity signal from the time counter means 210 is applied to a data terminal D of the flip-flop 213. At the time point of termination (the time point of fall) of the input time signal 302, the output at a $\overline{Q}$ output terminal of the D flip-flop 205 drops to an L logic, and its inverted signal is applied to a trigger terminal T of the D flip-flop 213, and consequently, the output of the monostable multivibrator 212 is input into the D flip-flop 213 at the time point of fall of the output at the $\overline{Q}$ output terminal of the D flip-flop 205.

The logic state of the output from the monostable multivibrator 212 input into the D flip-flop 213 is provided via its Q output to a controller 208 at the timing of termination of the input time signal. The controller 208 is formed by, for example, a microcomputer. In the event that the output of the D flip-flop 213 is an H logic at the timing of termination of the input time signal, it is decided that the pulse width (the time interval) of the input time signal is within the permissible or valid range, and the count value of the counter 209 is input, as a valid measured data, into the controller 208. From the thus input valid measured data is obtained the time interval value $T_X$ of the input time signal by the calculation of the following equation:

$$T_X = (10^N - P + B) \cdot T_0 \qquad (2)$$

where B is the final count value obtained from the counter 209. The time interval value $T_X$ thus obtained is stored in storage means incorporated in the controller 208. When the number of such stored valid data reaches a predetermined value, for example, 100, maximum and minimum values are obtained from the 100 valid data and displayed on a display 214. Alternatively, a mean value of the 100 valid data is computed and displayed on the display 214, or a standard deviation of the valid data or jitter is calculated and displayed on the display 214.

Next, a description will be given of the operation of this embodiment. The controller 208 outputs a reset signal 301, shown in FIG. 2A, by which the D flip-flops 204 and 205 in the gate means 202 and the D flip-flop 213 serving as the decision means are reset to their initial state. The preset value P corresponding to the aforementioned minimum value is preset in the counter 209. When the input time signal 302, shown in FIG. 2B, is applied to the input terminal 201 in the abovesaid initial state, the D flip-flop 204 is triggered by the rise of the input time signal 302 to derive an H logic signal 304 at its Q output, as shown in FIG. 2D.

On the other hand, in the initial state, the D flip-flop 205 is in its reset state, and hence derives an H logic signal at its $\overline{Q}$ output terminal. Accordingly, the AND circuit 206 is opened at the same time as the H logic signal is provided from the Q output terminal of the D flip-flop 204, and the clock pulses 306 from the clock pulse source 203 are provided from the AND circuit 206.

Upon completion of one input time signal 302, the D flip-flop 205 is triggered by the rise of an inverted signal 303 of the input time signal 302 to input the output of the D flip-flop 204. That is, an H logic signal is read into the D flip-flop 205, which, in turn, derives at its $\overline{Q}$ output terminal an L logic signal 305 shown in FIG. 2E. When the D flip-flop 205 yields the L logic signal 305, the AND circuit 206 is closed. In this way, the AND circuit 206 provides at its output clock pulses 306a, 306b and 306c gated for periods corresponding to the durations (time intervals) of the input time signals 302a, 302b and 302c, respectively, as shown in FIG. 2G. The output clock pulses 306a, 306b and 306c depicted in FIG. 2G respectively illustrate the cases where the duration of the input time signal 302 is smaller than the permitted minimum value, within the permissible range and greater than the permitted maximum value.

In the case where the duration of the input time signal 302 is shorter than the preset permitted minimum value, i.e. 950 nanoseconds, the number of output clock pulses from the gate means 202 is smaller than 38. In such a case, even if the time point $t_1$ at which the input time signal 302 terminates is reached, the counter 209 does not yield a carry signal, and consequently, the monostable multivibrator 212 is not activated. Therefore, when the fall of the signal 305 is provided to the trigger terminal T of the D flip-flop 213 at the end of the input time signal 302a, the D flip-flop 213 reads thereinto the L logic state of the monostable multivibrator 212 since the monostable multivibrator 212 is not operative at this time. As a result of this, an L logic signal is provided to the controller 208, so that the controller 208 decides that the measured value of the input time signal 302a counted by the counter 209 is invalid, and inhibits the input thereinto of the counted value and yields the reset signal 301.

Next, a description will be given of the case where the duration of the input time signal 302 is within the permissible range. In this case, the number of output clock pulses 306b of the gate means 202 reaches a predetermined value (a number corresponding to the minimum value of the time interval to be measured) before the time point $t_3$ of termination of the input time signal 302b. That is, the number of output clock pulses 306b exceeds 38. When supplied with 38 or more clock pulses, the counter 209 yields a carry signal 307 (FIG. 2H) at the time point $t_2$ prior to the time point $t_3$, activating the monostable multivibrator 212. The monostable multivibrator 212 yields such a validity signal 308 of the H logic as shown in FIG. 2I for only the period $T_K$ which is equal to the permissible range $2\delta$ subtracted by one clock period $T_0$, as referred to previously. Since the input time signal 302b terminates while the counter 209 is operative, the D flip-flop 213 serving as decision means inputs thereinto the validity signal 308 of the H logic at the terminating time point $t_3$ of the input time signal 302b and produces, as the result of its decision, such an H logic signal 309 as shown in FIG. 2J. The controller 208 is notified of the end of the input time signal 302b by the fall of the output at the $\bar{Q}$ output terminal of the D flip-flop 205 down to the L logic. Then, the controller 208 checks the logic state at the Q output terminal of the D flip-flop 213 and decides that while the output at this terminal is the H logic, that is, while the validity signal 308 is present, the input time signal 302b terminates, and hence falls within the preset permissible range. Thus the controller 208 inputs the count value of the counter 209. Thereafter, the controller 209 produces the reset signal 301.

FIGS. 3A, 3B, 3C show the possible cases in which the monostable multivibrator 212 yields the validity signal 308 of the H logic. Since the operating time $T_K$ of the monostable multivibrator 212 is set to be $2\delta - T_0$, if $\delta$ and $T_0$ are set to 50 nanoseconds and 25 nanoseconds, respectively, then the operating time $T_K$ becomes 75 nanoseconds. Since the rise of the input time signal 302 and the clock pulses 306 are not synchronized with each other, the time point at which the counter 209 yields a carry signal is in the time interval $T_C$ between time points 950 nanoseconds and 975 nanoseconds after the rise of the input time signal 302b, as shown in FIG. 3A. This is the same cause of what is called a quantizing error. Owing to this dispersion, the probability of deciding, as valid data, measured data of input time signals having durations of 950 to 975 nanoseconds and 1025 to 1050 nanoseconds is 50% as shown in FIG. 3C if the relationship between the input time signals and the clock pulses are completely random. That is, input time signals of durations in the abovesaid ranges are input into the controller 208 at the rate of two to one. In practice, however, the 50% collecting ratio of measured values does not present any problem. The reason is that the measurement does not need to pick out all measured values falling within the appropriate range but needs only to collect a desired number of measured values within a certain period of time. It is evident that the region in which the ratio of collecting the measured values is 50% can be reduced by decreasing the clock period $T_0$.

In contrast thereto, in the region in which the duration of the input time signal 302 is in the range of 975 to 1025 nanoseconds, their measured values are all picked out as valid data; namely, in this region, the probability of collecting the measured data is 100%.

The controller 208 performs the operation of Eq. (2) for the thus input valid data to thereby obtain the duration $T_X$ of the input time signal 302b, and its result is displayed on the display 214. Furthermore, a deviation is obtained between the firstly obtained duration $T_X$ and each of durations obtainable from second and subsequent input measured values on the basis of the first input one, and positive and negative maximum values of the deviation are stored. At the same time, the number of times the measured values are input is counted, and when it reaches, for example, 100, maximum and minimum values of jitter are obtained from the positive and negative maximum values of the deviation and displayed on the display 214. It is also possible, in this case, to display, for example, the mean value of all measured values or a standard deviation of jitter, other than the maximum and minimum values.

When the duration of the input time signal 302 is longer than the predetermined value, the gate means 202 provides the clock pulses 306c, as shown in FIG. 2G in connection with the input time signal 302c. In this case, the input time signal 302c terminates at a time point $t_5$ after a time point $t_4$ at which the monostable multivibrator 212 stops its operation, that is, the validity signal 308a ends. Consequently, at the time point $t_5$ at which the D flip-flop 213 for decision is supplied with a trigger signal, the monostable multivibrator 212 is already out of operation and the validity signal 308a does not exist, that is, the output of the monostable multivibrator 212 has already been returned to the L logic. Therefore, the D flip-flop 213 inputs thereinto the L logic at the time point $t_5$ of termination of the input time signal 302c. The controller 208 decides, from the L logic, the count value of the counter 209 as being invalid and yields the reset signal 301 without inputting thereinto the count value.

It is also possible to adjust the permissible range $2\delta$, which is the difference between minimum and maximum values of the time interval to be measured, by changing the operating time of the monostable multivibrator 212 by adjusting, for example, a time constant resistor 215. When continuously supplied at its preset terminal P with an H logic signal via a switch 216, the D flip-flop 213 serving as decision means always yields an H logic signal from its Q output terminal regardless of the duration of the input time signal. Accordingly, in this case, all measured values of the input time signal 302 are input, as valid data, into the controller 208.

Figure 4:
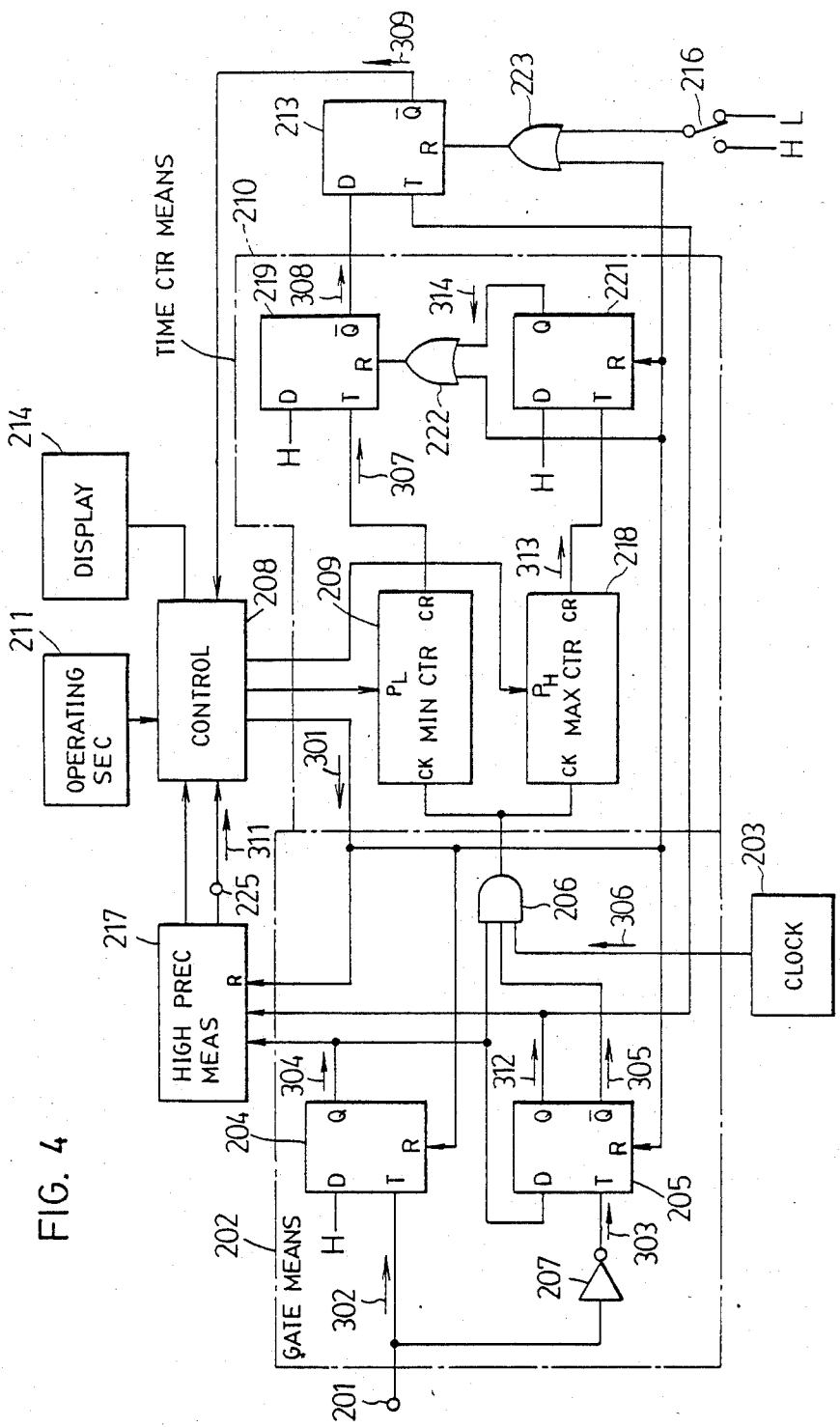
FIG. 4 is a block diagram illustrating another embodiment of the instrument of the present invention.

FIG. 4 illustrates another embodiment of the present invention, in which the parts corresponding to those in FIG. 1 are identified by the same reference numerals. In the embodiment of FIG. 1, the minimum value counter 209 is used both as means for measuring the duration of the input time signal 302 and as means for detecting the lapse of time corresponding to the minimum value of the time interval to be measured, whereas, in the embodiment of FIG. 4, high precision time interval measuring means 217 is provided which is capable of measuring time intervals with higher degree of accuracy than does the counter 209. As the high precision measuring means 217, it is possible to employ, for example, such a measuring means as described in U.S. Pat. No. 4,267,436, as referred to previously. Moreover, this example employs, in addition to the minimum value counter 209, a maximum value counter 218 which yields an output when having counted clock pulses for a predetermined period of time from the rise of the input time signal to the maximum value of the time interval to be measured, that is, which detects the lapse of time from the beginning of the input time signal to the maximum value of the time interval to be measured, thereby producing a validity signal over a predetermined time interval between the occurrence of the output from the minimum value counter 209 and the occurrence of the output from the maximum value counter 218.

In the case where an N-digit decimal counter is used as the maximum value counter 218, if the maximum value of the time interval to be measured is represented by h, the following value is preset in the maximum value counter 218:

$$P_H = 10^N - h/T_0 \quad (3)$$

On the other hand, the following value is preset in the minimum value counter 209:

$$P_L = 10^N - l/T_0 \quad (4)$$

where l represents the minimum value of the time interval to be measured. In general, the minimum and maximum values l and h are selected such that $l = A - \delta$ and $h = A + \delta$, where A is a reference time interval to be measured. However, they need not always be selected so.

The output pulses of the gate means 202 are also supplied to and counted by maximum value counter 218. The carry out of the minimum value counter 209 is provided to a trigger terminal T of a D flip-flop 219. To its data terminal D is supplied an H logic signal, and the output at its $\overline{Q}$ output is provided, as the output of the time counter means 210, to the data terminal D of the D flip-flop 213 serving as decision means. The carry output of the maximum value counter 218 is provided to a trigger terminal T of a D flip-flop 221, and the output of its Q output terminal is provided via an OR circuit 222 to a reset terminal R of the D flip-flop 219.

The outputs at the Q output terminals of the D flip-flops 204 and 205 are supplied to the high precision time interval measuring meanas 217. In this example, the output at the Q output terminal of the flip-flop 205 is applied to the trigger terminal T of the D flip-flop 213. The reset signal 301 from the controller 208 is applied to reset terminals R of the D flip-flops 219 and 221 and the time interval measuring means 217 and to the D flip-flop 213 via an OR circuit 223. The OR circuit 223 is also supplied with the selected output of the switch 216.

Figure 5:
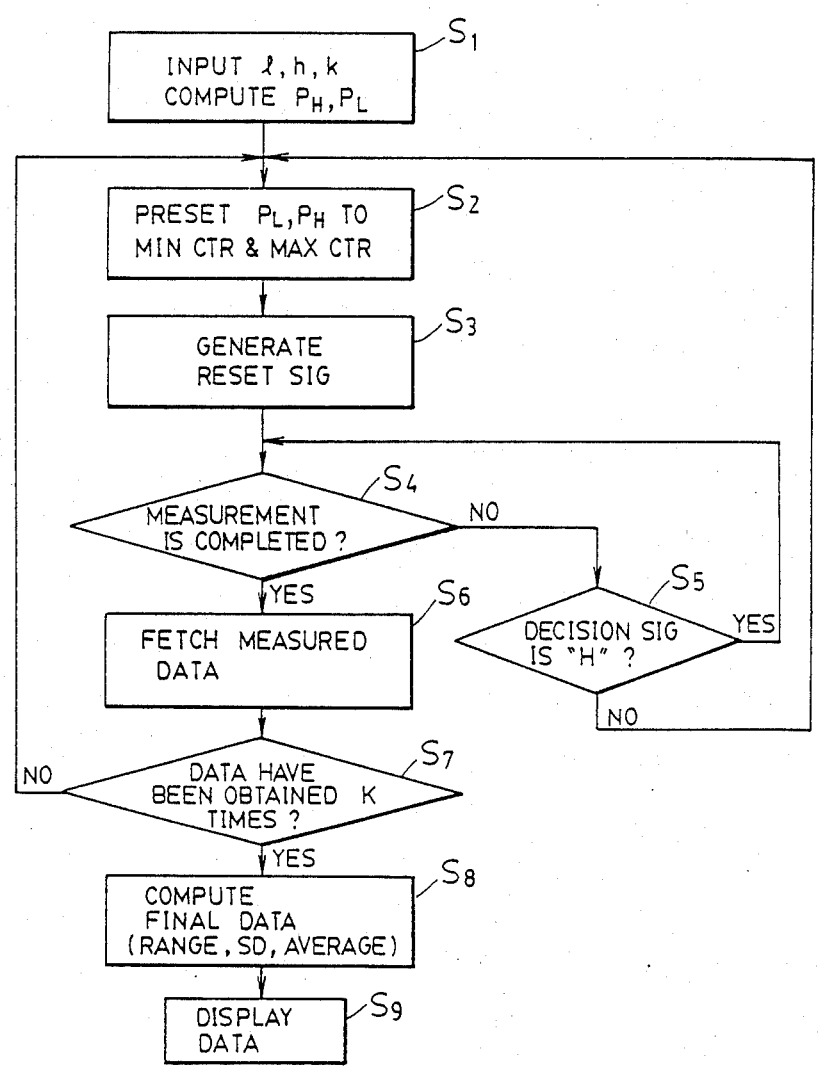
FIG. 5 is a flowchart showing the operation of the instrument shown in FIG. 4.
Figure 6:
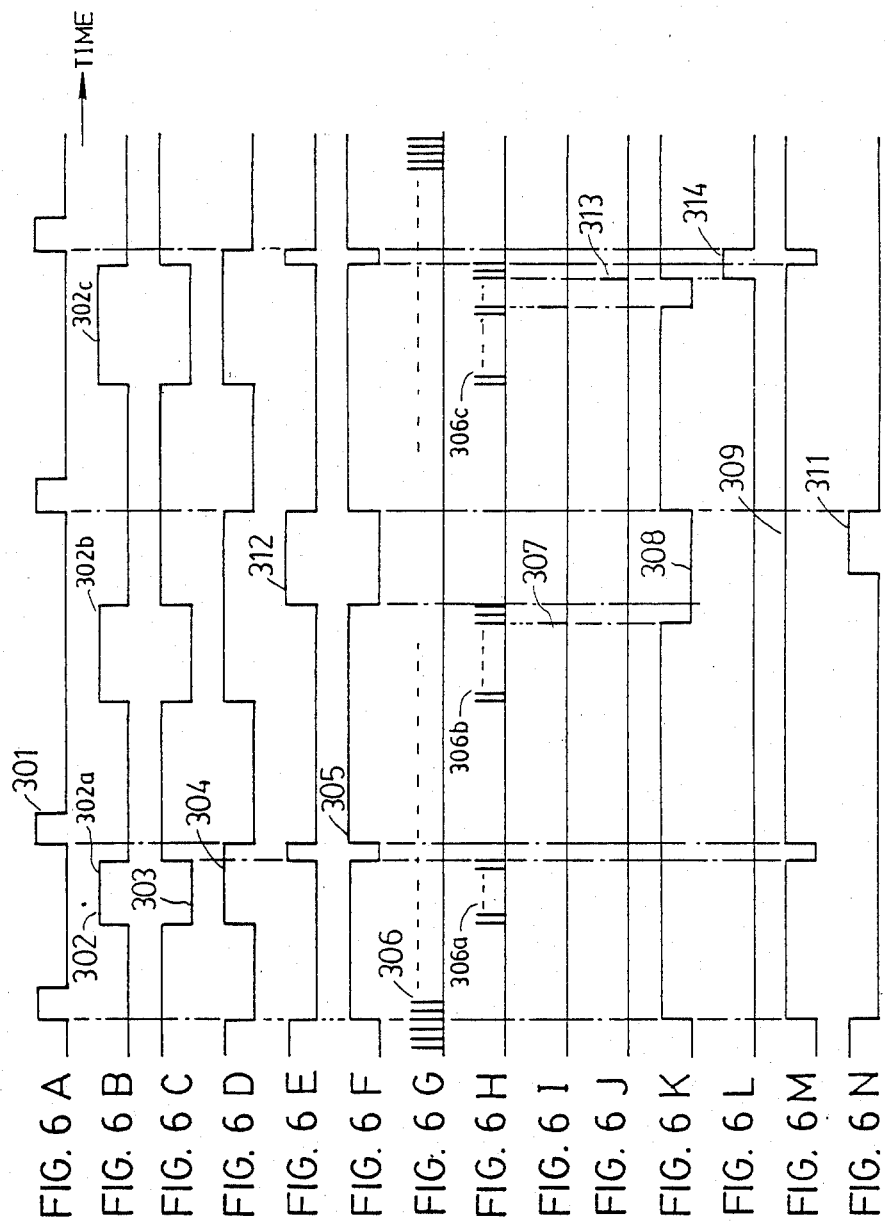
FIGS. 6A through 6N are timing chart explanatory of the operation of the instrument shown in FIG. 4.

Next, a description will be given, with reference to a flowchart of FIG. 5 and a timing chart of FIGS. 6A to 6N, of the operation of the embodiment shown in FIG. 4. When the minimum and maximum values l and h of the time interval to be measured and the number of measurements K are set and entered through the operating section 211 in step $S_1$, the controller 208 calculates the preset values $P_H$ and $P_L$ according to Eqs. (3) and (4), respectively, and stores them in its memory, along with the number of measurements K.

In step $S_2$ the minimum and maximum preset values $P_L$ and $P_H$ are preset in the minimum and maximum value counters 209 and 218, respectively. This presetting can be achieved, for example, by providing the preset value $P_L$ on a data bus and then selecting the minimum value counter 209 by an address bus (not shown) in the same manner as in the case of an ordinary microcomputer. Next, in step $S_3$, the controller 208 provides the reset signal 301 to the flip-flops 204, 205, 213, 219 and 221 and the measuring means 217 to reset them.

It is checked in step $S_4$ whether measurement has been completed. That is, as is the case with the embodiment of FIG. 1, by the rise of, for instance, the input time signal 302a (FIG. 6B) input after the above resetting, the gate means 202 is activated to yields clock pulses 306a, as shown in FIG. 6H, which are counted by the counters 209 and 218, respectively. Further, by the rise of the input time signal 302a, the output 304 at the Q output terminal of the flip-flop 204 is made to assume the H logic, and this H logic output is provided to the measuring means 217, initiating measurement of the time interval. Upon completion of the time interval measurement, the measuring means 217 outputs an H logic signal 311 (FIG. 6N) from its output terminal 225. The controller 208 checks whether the signal 311 from the output terminal 225 is the H logic or L logic, thereby detecting whether the measurement has been completed.

In the case where it is detected in step $S_4$ that the measurement has not as yet been completed, the logic state of the signal 309 (FIG. 6M) indicating the decision result, from the $\overline{Q}$ output terminal of the D flip-flop 213, is checked in step $S_5$. In the event that the signal 309 is the H logic, the operation returns to step $S_4$. In this case, the duration of the input time signal 302a is shown to be smaller than the minimum value l of the time interval to be measured. It is assumed the measurement of the time interval by the measuring means 217 calls for a longer period of time than the duration of the input time signal. Accordingly, in the case of the input time signal 302a, since no carry signal is produced from the minimum value counter 209 when the input signal 302a falls, the output 308 at the $\overline{Q}$ output terminal of the D flip-flop 219 is H logic, as shown in FIG. 6K, and no validity signal is provided. In this embodiment the validity signal is yielded in the form of L logic. Accordingly, this H logic is input into the D flip-flop 213 at the end of the input time signal 302a, and the output 309 at its $\overline{Q}$ output terminal becomes L logic, as shown in FIG. 6M. The controller 208 inputs this L logic and decides that the input time signal 302a falls outside the preset range (l to h) (step $S_5$), after which the process goes back to step $S_2$.

Thus, the presetting of the counters 209 and 218 and the resetting of each part are effected, after which the input time signal 302a is input, initiating the counting of clock pulses by the counters 209 and 218 and the measurement by the measuring means 217 in the same manner as described above. In this case, the duration of the input time signal 302b is in the preset range (l to h). Accordingly, before the input time signal 302b ends (falls), the minimum value counter 209 yields the carry signal 307, as shown in FIG. 6I, and H logic is input into the flip-flop 219 to make the signal 308 at its $\overline{Q}$ output terminal L logic, as shown in FIG. 6K, producing a validity signal. In the duration of the validity signal the input time signal 302b ends and the L logic validity signal is input into the D flip-flop 213. In this case, the output at its $\overline{Q}$ output terminal remains H logic, indicating that the measured data is valid. The input time signal 302b falls, and the D flip-flop 205 derives at its Q output terminal an H logic signal 312, as shown in FIG. 6E, which is provided to the measuring means 217. The measuring means 217 measures, with high accuracy, the time interval between the rise of the signal 304 and the following rise of the signal 312. When the result of the measurement is obtained, the signal 311 at the output terminal 225 of the measuring means 217 becomes H logic, as shown in FIG. 6N. Upon detection of the H logic of the signal 311 in step $S_4$, the measured data by the measuring means 217 is input into the controller 208 in step $S_6$, and in step $S_7$, it is decided whether the number of measurements has reached K. If not, the process goes back to step $S_2$.

In a likewise manner, the measurement for the input time signal 302c is started. In this embodiment, the duration of the input time signal 302c is greater than the maximum value h, and the operation until a carry signal is derived from the minimum value counter 209 is the same as in the case of the input time signal 302b. In this case, a carry signal 313 is produced from the maximum counter 218 in the time interval between the outputting of a carry signal from the minimum value counter 209 and the termination of the input time signal 302c, as shown in FIG. 6J. By this signal 313, H logic is input into the D flip-flop 221 to make the output 314 at its Q output terminal H logic, resetting the D flip-flop 219. Consequently, the output 308 at the $\overline{Q}$ output terminal of the D flip-flop 219 becomes H logic, terminating the validity signal. Thereafter, the input time signal 302c ends, and by its fall, the H logic from the $\overline{Q}$ output of the D flip-flop 219 is input into the D flip-flop 213, resulting in the decision signal 309 becoming L logic, as shown in FIG. 6M. Thus, before the measured data for the input time signal 302c is obtained, it is decided in step $S_5$ that the signal 302c is outside the preset permissible range, and the process returns to step $S_2$.

When it is decided in step $S_7$ that the measurement has been carried out K times, that is, measured data have been obtained K times, the process proceeds to step $S_8$, in which final calculations for the mean value, the range and the standard deviation are effected, and the results of the calculations are displayed on the display 214 in step $S_9$. In this embodiment, when the switch 216 is held on the H logic side to retain the D flip-flop 213 in its reset state at all times, the controller 208 regards all inputs time signals as valid and input their measured data.

Figure 7:
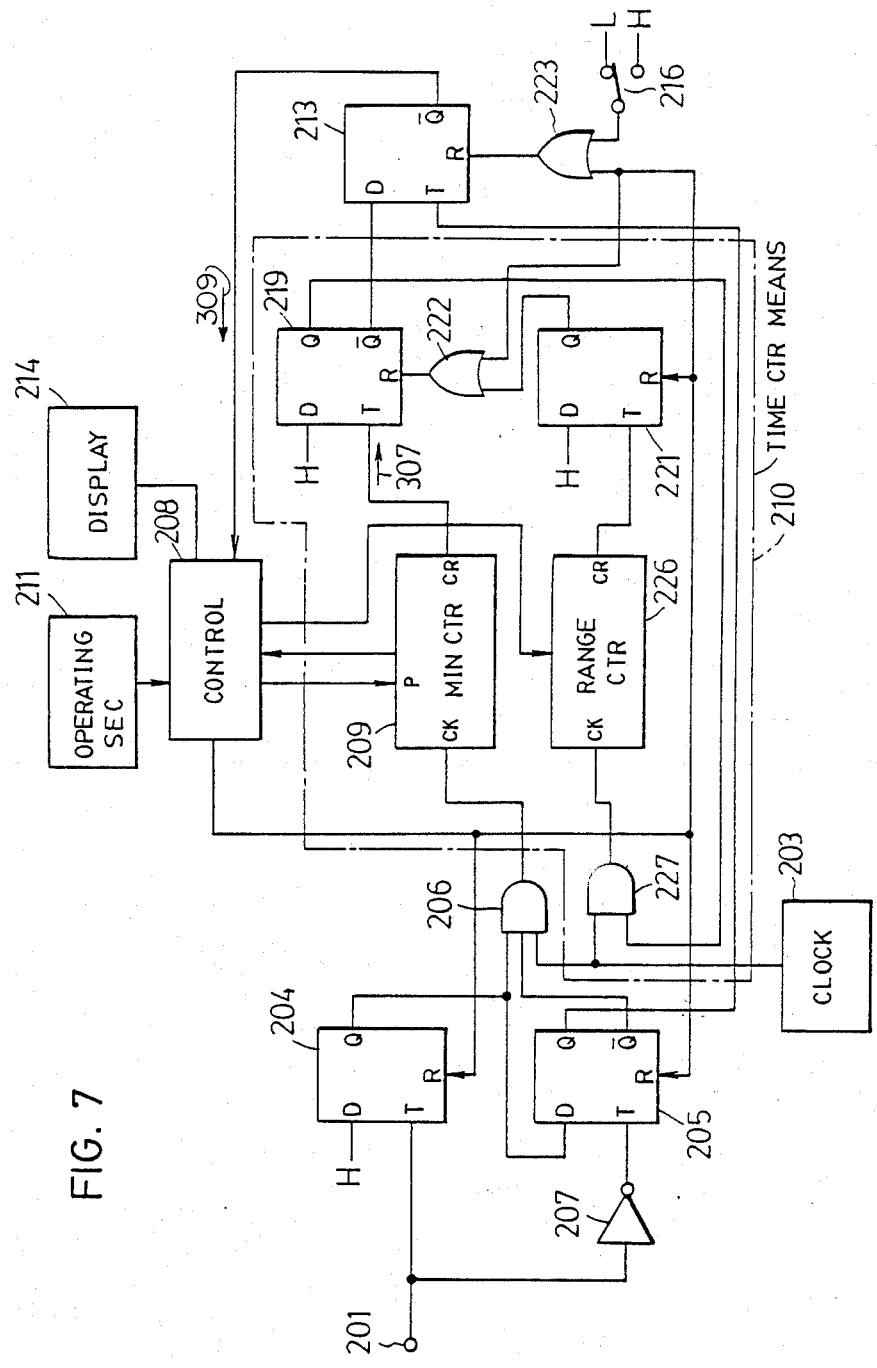
FIG. 7 is a block diagram illustrating still another embodiment of the instrument of the present invention.

In the embodiment of FIG. 1, the timer means 212 may also be formed by a counter, other than the monostable multivibrator 212. For example, as shown in FIG. 7 in which the parts corresponding to those in FIGS. 1 and 4 are identified by the same reference numerals, a range counter 226 is provided in the time counter means 210. When the range counter 226 is an N-digit decimal up counter, $10^N - (h-1)/T_0$ is reset therein. The clock pulses from the clock source 203 are also provided to an AND circuit 227, and the output clock pulses therefrom are counted by the range counter 226. The output of the minimum value counter 209 is applied to the trigger terminal T of the D flip-flop 219 as in the case of FIG. 4, and the output at its Q output terminal is provided to the AND circuit 227. A carry signal of the range counter 226 is supplied to the trigger terminal T of the D flip-flop 221. The other connections to the D flip-flops 219 and 221 are identical to those in FIG. 4. Upon occurrence of the carry signal 307 from the minimum value counter 209, the H logic of Q output of the D flip-flop 219 opens the AND gate 227 to pass therethrough the clock pulses to the range counter 226, which starts to count them, and then when a carry signal is generated from the range counter 226, the same results as those in the case of a carry signal being produced from the maximum value counter 218 are obtained. Thus, it will be appreciated that the arrangement of FIG. 7 also performs the intended operations.

With the arrangements of FIGS. 1 and 7, it is also possible to achieve high precision measurement by providing the high precision time interval measuring means 217 as in the case of FIG. 4. Further, in the case where the high precision time interval measuring means 217 is not employed, when the logic state of the decision output 309 of the D flip-flop 213 is H logic at the time point of the termination of the input time signal 302, the count value of the minimum or maximum counter 209 or 218 may also be input into the controller 208, as the measured value for the input time signal. In the case of inputting the count value of the maximum value counter 218, the time interval that is desired to be obtained is $(C - P_H) \times T_0$, where C is the count value.

In the above, the reference time A and the permissible range $2\delta$ are sometimes entered from the operating section 211. In this case, the reference time A is entered as a time value, but the permissible range $2\delta$ may be entered as a time value, as a percentage relative to the reference time A, or as a value n set to bear a relation of $T_{sig}/2^n$ (where $T_{sig}$ is a preset value of a fundamental clock period of the input time signal 302 and $N = 0, 1, 2, \ldots$). In any case, the preset values $P_L$ and $P_H$ are computed in accordance with their setting. It is also possible to set, from the operating section 211, minimum and maximum values l and h of the time interval to be measured, or the minimum value l and the permissible range $2\delta$ in the form of time values.

While in the above the counters 209, 218 and 226 are synchronous counters which perform counting in synchronism with the input clock pulses, they may also be of the asynchronous type. In such a case, a time lag between the counter 209 and the counter 218 or 226 is compensated for by a compensating variable delay circuit such as a monostable multivibrator which is connected to the output side of each of the counters 209 and 218 or 226. Also it is possible to employ down counters as the counters 209, 218 and 226, in which case, when having counted values corresponding to the minimum value l, the maximum value h and the permissible range (h to l), they generate borrow carry signals, which are used in place of the aforesaid carry signals.

The gate means 202 may also be formed, for example, as shown in FIG. 8, in which a JK flip-flop 228 is used. The JK flip-flop 228 is supplied at its terminals J and K with H logic, and when reset by the reset signal 301, it derives an H logic signal at its $\overline{Q}$ output terminal. The H logic signal is provided to an AND gate 229. Accordingly, when the input time signal 302 is applied from the input terminal 201, the signal 302 is provided to a trigger terminal T of the JK flip-flop 228 via the AND gate 229 and an OR gate 231, and by the rise of the input time signal 302, the output at a Q output terminal of the JK flip-flop 228 is made H logic. This H logic output is applied to the AND circuit 206, permitting the passage therethrough of the clock pulses from the clock source 203. The H logic signal at the Q output terminal is also provided to an AND gate 232. When the input time signal 302 falls, the output of the inverter 207 goes H logic, which is passed through the AND gate 232 and the OR gate 231 to the trigger terminal T of the JK flip-flop 228 to cause it to toggle, making the output at its Q output terminal L logic.

The input time signal is not limited specifically to the signal of a duration equal to the time interval to be measured but may sometimes be input as two pulse signals having a pulse interval equal to the time interval to be measured. In such a case, a first one of the two pulse signals is provided to the trigger terminal T of the D flip-flop 204 and the other signal is applied to the trigger terminal T of the D flip-flop 205.

As has been described in the foregoing, according to the present invention, the duration of the input time signal is measured, and at the same time, it is decided whether the duration of the input time signal is within a preset permissible range, and only the measured value in that range is used. Accordingly, since the duration of the input time signal equal to a time interval desired to measured can be measured with high efficiency, many valid data can be obtained in a short time. In addition, the thusly obtained data need not be transferred to a computer after being subjected to arithmetic processing, and hence they can be processed at high speed. Conventionally, unnecessary input time signals are also measured one after another and their measured values are transferred to a computer, wherein it is decided whether they are within a preset range; therefore, much time is needed. In contrast thereto, the present invention obviates such a defect.

As described previously, by the provision of high precision time interval measuring means separately of the time counter means 210, time intervals can be measured with a high accuracy of, for instance, 100 ps or so. At present, however, the accuracy of measurement obtainable with time measuring means using an economical counter is about 2 ns at the highest.

It will be apparent that many modifications and variations may be effected without departing from the scope of the novel concepts of the present invention.

What is claimed is:

1. A time interval measuring instrument comprising:
a clock pulse source for generating clock pulses;
gate means supplied with the clock pulses from the clock pulse source and an input time signal, for outputting the clock pulses for a period of time corresponding to the duration of the input time signal;
time counter means supplied with the clock pulses from the gate means, for generating a validity signal for a period corresponding to the difference between predetermined minimum and maximum values of time intervals of said input time signal to be measured;
decision means supplied with the validity signal from the time counter means and a signal corresponding to the end of the input time signal, for deciding whether the validity signal exists at the end of the input time signal;
measuring means for measuring the duration of the input time signal; and
control means for inputting thereinto the measured value from the measuring means, as valid data, when the validity signal is decided to exist at the end of the input time signal according to the result decision by the decision means.

2. A time interval measuring instrument according to claim 1, wherein the control means includes means for presetting, for each measurement by the measuring means, in the time counter means, a value corresponding to the minimum value of the time interval to be measured and a predetermined one of a value corresponding to the maximum value of the time interval to be measured and a permissible range which is the difference between the minimum and the maximum values.

3. A time interval measuring instrument according to claim 2, wherein the time counter means includes minimum value counting means preset to the value corresponding to the minimum value, for generating an output when having counted the clock pulses over a period of time corresponding to the minimum value of the time interval to be measured.

4. A time interval measuring instrument according to claim 3, wherein the time counter means includes timer means which is activated by the output of the minimum value counting means to yield the validity signal for a period of time corresponding to the permissible range.

5. A time interval measuring instrument according to claim 4, wherein the timer means comprises a range counter which is preset to a value corresponding to the permissible range and starts counting of the clock pulses upon occurrence of the output from the minimum value counting means and yields an output when having counted the clock pulses for the period of time corresponding to the permissible range, and a circuit which yields the validity signal over the time interval between the occurrence of the output from the minimum value counting means and the occurrence of the output from the range counter.

6. A time interval measuring instrument according to claim 3, wherein the time counter means includes maximum value counting means which is preset to said value corresponding to the maximum value and yields an output when having counted clock pulses for a period of time corresponding to the maximum value of the time interval to be measured, and a circuit which yields the validity signal over the time interval between the occurrence of the output from the minimum value counting means and the occurrence of the output from the maximum value counting means.

7. A time interval measuring instrument according to claim 6, wherein the measuring means comprises the maximum value counting means.

8. A time interval measuring instrument according to any one of claims 3 to 6, wherein the measuring means has higher accuracy of measurement than does the minimum value counting means.

9. A time interval measuring instrument according to any one of claims 3 to 6, wherein the measuring means comprises the minimum value counting means.

10. A time interval measuring instrument according to any one of claims 1 to 6, wherein the decision means is a flip-flop which stores the output of the time counter means at the end of the input time signal.

11. A time interval measuring instrument according to claim 10, which further includes means for setting the flip-flop so that it yields the validity signal at all times.

12. A time interval measuring instrument according to any one of claims 1 to 6, which further includes a display for displaying said measured data input as said valid data into the control means.

13. A time interval measuring instrument according to claim 12, wherein the control means includes means for calculating selected statistics on a plurality of the measured data input into the control means as valid data, and for displaying the results of said calculating, on the display.

14. A time interval measuring instrument according to claim 2, wherein the duration of the validity signal is provided to be equal to said permissible range substracted by a clock period of the clock pulses.

15. A device for measuring jitter in the durations of a plurality of input time signals of at least one nominal period, comprising:
setting means for setting said selected nominal period and a selected range in the jitter about said nominal period, for which the durations of the respective input time signals are to be measured;
measuring means for successively measuring at least a part of the duration of each respective input time signal while concurrently determining, based on the set data, whether each respective duration thereof is within said range, wherein the full duration of each said input time signal within said range is measured; and storing means for storing only each measured duration that is determined to be within said range.

16. The device of claim 15, wherein said measuring means includes means for beginning the generation of a validity signal when the time of measuring the duration of each respective input time signal first enters said range, for terminating said validity signal at the time of said measuring that corresponds to the upper limit of said range, and for performing said determining based on whether the respective input time signal ends during the occurrence of said validity signal.

17. The device of claims 15 or 16, said data being the limit values of said range.

18. The device of claim 15 or 16, said data being the lower limit of said range and the width of said range.

* * * * *

UNITED STATES PATENT AND TRADEMARK OFFICE
CERTIFICATE OF CORRECTION

PATENT NO. : 4,611,926
DATED : 16 September 1986
INVENTOR(S) : MISHIO HAYASHI

It is certified that error appears in the above-identified patent and that said Letters Patent is hereby corrected as shown below:

Front Page, [57] ABSTRACT, line 6, after "by" insert --a controller--;
        line 11, delete "and only for";
        line 12, after "signal," insert --and, only for--.

Col. 1, line 49, "each" should be --such--.

Col. 2, line 32, "required to," should be --required, to--.
Col. 3, line 31, "chart" should be --charts--.

Col. 4, line 46, "202" should be --209--;
        line 50, "202" should be --209--.

Col. 11, line 33, "input" should be --inputs--.

Col. 13, line 4, after "to" (second occurrence) insert --be--.

Col. 14, line 9, delete "of".

Col. 16, line 7, "claims" should be --claim--.

Signed and Sealed this

Thirteenth Day of January, 1987

Attest:

DONALD J. QUIGG

Attesting Officer        Commissioner of Patents and Trademarks